(12) United States Patent
Hardee

(10) Patent No.: US 6,552,943 B1
(45) Date of Patent: Apr. 22, 2003

(54) SENSE AMPLIFIER FOR DYNAMIC RANDOM ACCESS MEMORY ("DRAM") DEVICES HAVING ENHANCED READ AND WRITE SPEED

(75) Inventor: Kim Carver Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 09/652,512

(22) Filed: Aug. 31, 2000

(51) Int. Cl.[7] .................................................. G11C 7/00
(52) U.S. Cl. ........................ 365/205; 365/149; 365/204
(58) Field of Search ................................ 365/205, 204, 365/149, 129, 189.01; 327/57

(56) References Cited

U.S. PATENT DOCUMENTS

| | | | | |
|---|---|---|---|---|
| 4,804,871 A | * | 2/1989 | Walters, Jr. | 327/54 |
| 5,267,197 A | * | 11/1993 | McClure | 365/189.01 |
| 5,936,897 A | * | 8/1999 | Koga | 365/190 |
| 6,147,925 A | * | 11/2000 | Tomishima et al. | 365/230.03 |
| 6,208,574 B1 | * | 3/2001 | Hardee | 365/205 |

FOREIGN PATENT DOCUMENTS

GB      290404 A2 * 10/1990

OTHER PUBLICATIONS

Dense Sense Amplifier/Latch Combination, "IBM Technical Disclosure Bulletin", Oct. 1986, vol. 29, No. 5, pp 2160–2160.*
Sense Amplifier for Capacitive Storage, "IBM Technical Disclosure Bulletin", Jul. 1976, vol. 19, No. 2, pp 407–408.*
Memory Sense Amplifier, "IBM Technical Disclosure Bulletin", Apr. 1976, vol. 18, No. 11 pp 3601–3603.*

* cited by examiner

*Primary Examiner*—Hoai Ho
(74) *Attorney, Agent, or Firm*—William J. Kubida; Peter J. Meza; Hogan & Hartson LLP

(57) ABSTRACT

A sense amplifier design for DRAM devices (as well as those incorporating embedded DRAM) which provides improved read and write speed without requiring the use of an extra signal line to the gate of a transistor coupling the sense amplifier latch nodes to the associated bit lines. In accordance with the present invention, an additional circuit element is added between the latch nodes and the bit lines which serves as a resistive path therebetween. Functionally, this additional circuit element serves to isolate the latch nodes from the relatively large bit line capacitance during a write operation such that the latch nodes can change state more quickly. These additional circuit elements may take the form of N-channel transistors having their gate tied to a pumped voltage level VCCP, resistors, various configurations of depletion transistors or CMOS pass gates.

17 Claims, 2 Drawing Sheets

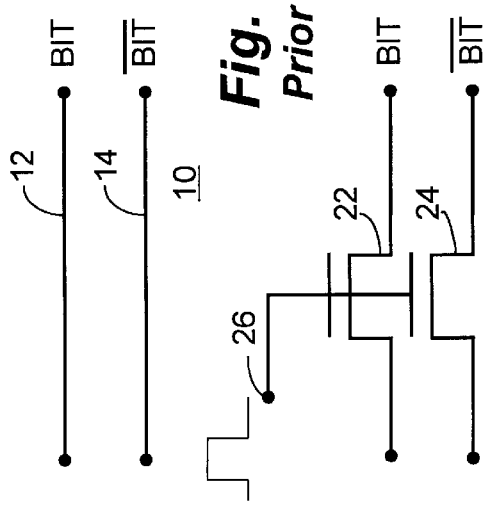
Fig. 1A Prior Art
Fig. 1B Prior Art
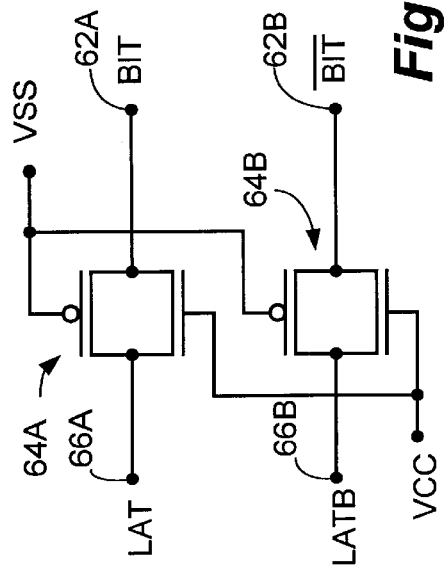
Fig. 3E
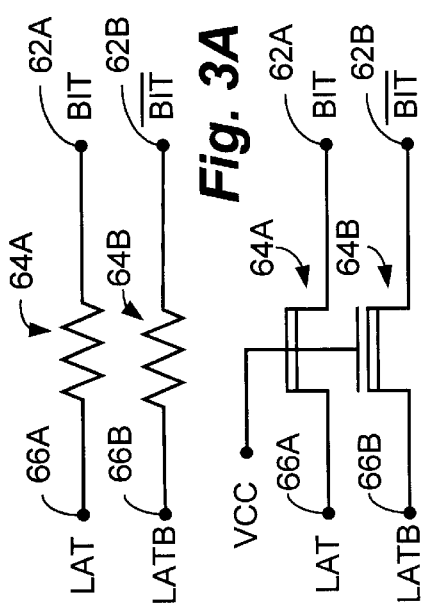
Fig. 3A
Fig. 3B
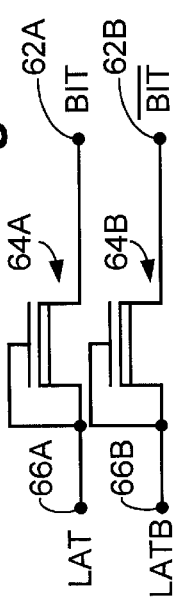
Fig. 3C
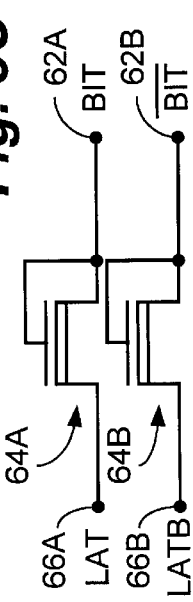
Fig. 3D

SENSE AMPLIFIER FOR DYNAMIC RANDOM ACCESS MEMORY ("DRAM") DEVICES HAVING ENHANCED READ AND WRITE SPEED

CROSS REFERENCE TO RELATED PATENT APPLICATIONS

The present invention is related to the subject matter disclosed in co-pending U.S. patent application Ser. No. 09/651,939 entitled: "Local Write Driver Circuit for an Integrated Circuit Device Incorporating Embedded Dynamic Random Access Memory (DRAM)" assigned to the assignee of the present invention, the disclosure of which is herein specifically incorporated by this reference.

BACKGROUND OF THE INVENTION

The present invention relates, in general, to the field of integrated circuit memory devices. More particularly, the present invention relates to a sense amplifier design for integrated circuit dynamic random access memory ("DRAM") devices (as well as those incorporating embedded DRAM) which provides improved read and write speed without requiring the use of an extra signal line which must be driven to a relatively high (or "pumped") supply voltage level.

DRAM memory devices incorporate one or more arrays of memory cells, each generally consisting of a single transistor and associated capacitor. The transistor has one terminal coupled to an associated bit line and its gate coupled to a word line. Another terminal is generally coupled to a reference voltage level (VSS or circuit ground) through the capacitor and by enabling the transistor via the word line, the charge on the capacitor may be placed on the associated bit line. Due to the dynamic nature of the charge stored in the capacitor, it must be periodically refreshed to replenish the leaked charge.

The changes in the bit line potential due to the charge in the capacitor are first amplified by a sense amplifier to be read as either a logic level "one" or "zero" depending on the charge which has been transferred to the bit lines. Generally the sense amplifiers compare the data from the memory cells with a reference level which is stored in corresponding reference cells. At this point, the data which has been read out is then re-written to the memory cells during a precharge operation and the data is passed by means of an internal input/output ("I/O") bus and a data amplifier to circuitry external to the memory device.

In conventional sense amplifier designs, the complementary latch nodes are either directly connected to the associated bit lines or a transistor is used to couple the latch nodes to the corresponding bit lines pair. In the latter instance, the gate of the transistor has been controlled by a signal which varied in voltage level during the operation of the sense amplifier.

SUMMARY OF THE INVENTION

Disclosed herein is a sense amplifier design for DRAM devices (as well as those incorporating embedded DRAM) which provides improved read and write speed without requiring the use of an extra signal line to the gate of a transistor coupling the sense amplifier latch nodes to the associated bit lines. In accordance with the present invention, an additional circuit element is added between the latch nodes and the bit lines which serves as a resistive path therebetween. Functionally, this additional circuit element serves to isolate the latch nodes from the relatively large bit line capacitance during a write operation such that the latch nodes can change state more quickly.

The resistance of this circuit element is carefully chosen to balance the sense amplifier write speed with bit line recovery time. In general, a higher resistance is preferable for sense amplifier write speed but less desirable for bit line recovery time. Advantageously, this additional circuit element does not need to be controlled or "clocked" thereby eliminating the need for a signal line which is driven to a high (usually "pumped") supply voltage level. This saves power and reduces circuit complexity.

In various embodiments of the present invention disclosed herein, this additional circuit element may be an enhancement mode metal oxide semiconductor ("MOS") transistor with its gate tied to a high supply voltage level (i.e. VCCP approximately two times the normal supply voltage) or it may be a resistor; a depletion mode MOS transistor with its gate tied to either the normal power supply voltage (VCC) or to the source or drain connection or a complementary MOS ("CMOS") transmission (or "pass") gate with the gate of the P-channel transistor tied to a reference voltage level (circuit ground or VSS) and the gate of the N-channel transistor coupled to VCC. The addition of this circuit element also improves the speed of read operations due to the fact that the sense amplifier latch nodes can separate more quickly during sensing.

Particularly disclosed herein is a sense amplifier circuit for an integrated circuit memory comprising first and second complementary bit lines, first and second complementary latch nodes and first and second MOS transistors respectively coupling the first bit line to the first latch node and the second bit line to the second latch node. The first and second MOS transistors each have a control terminal thereof coupled to a constant voltage source. In other embodiments of the present invention, the first and second MOS transistors may be replaced by resistors, depletion mode transistors or CMOS pass gates.

Also particularly disclosed herein is a sense amplifier circuit for an integrated circuit memory comprising first and second complementary bit lines, first and second complementary latch nodes, first and second circuit elements respectively coupling the first bit line to the first latch node and the second bit line to the second latch node and a sense amplifier coupled between the first and second latch nodes, the latch circuit comprising first and second cross coupled inverters responsive to first and second complementary latch signals.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1A illustrates one conventional method of coupling the latch nodes of a sense amplifier to the bit lines through the use of a direct connection;

FIG. 1B illustrates another conventional method of coupling the latch nodes of a sense amplifier to the bit lines through the use of a pair of MOS transistors that have their gate terminals driven by a separate signal line;

FIGS. 3A through 3E illustrate representative alternative implementations of the additional circuit elements utilized for coupling the sense amplifier latch nodes to the bit lines shown in the preceding figure in the form of resistors, various configurations of depletion MOS transistors and CMOS pass gates.

DESCRIPTION OF A REPRESENTATIVE EMBODIMENT

Figure 2:
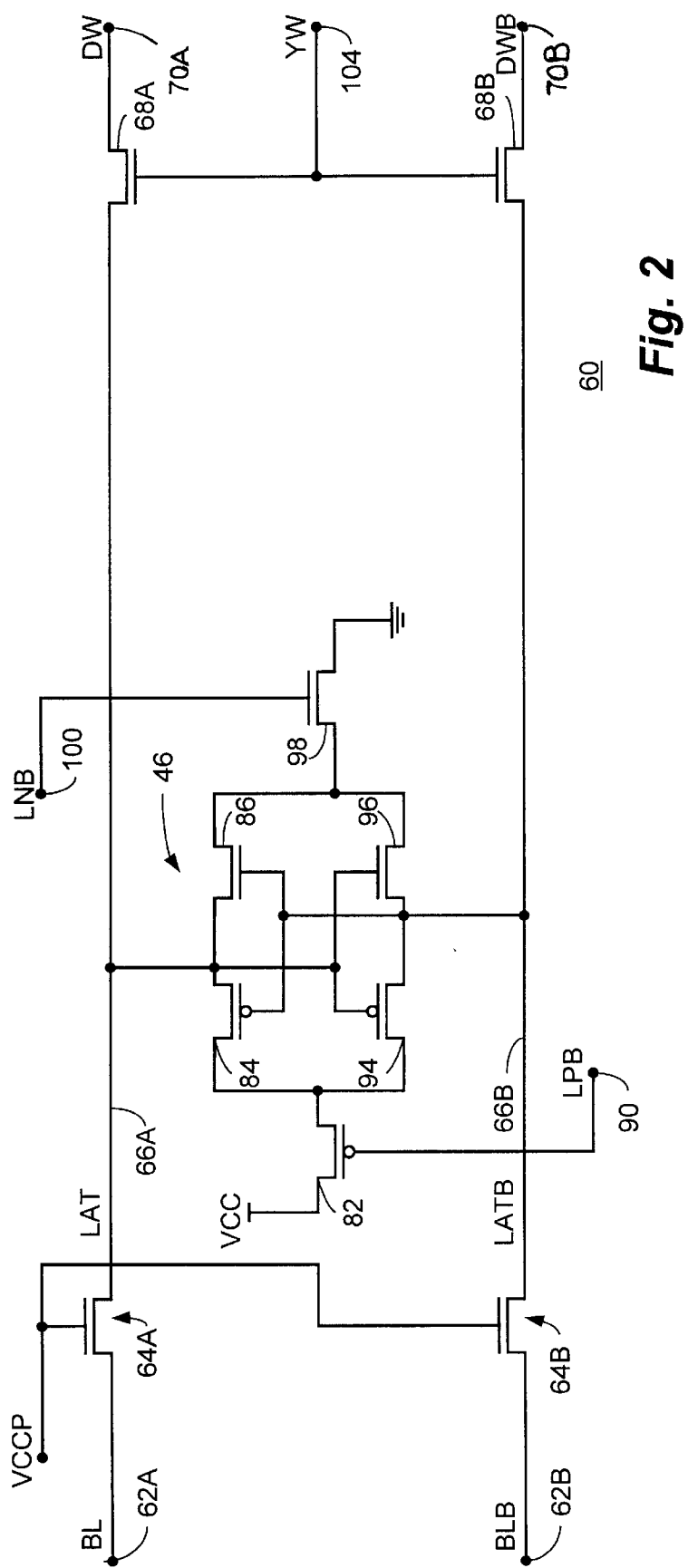
FIG. 2 is a detailed schematic illustration of the latch nodes and bit lines associated with a column sense amplifier in accordance with the embodiment illustrated in the preceding figure and which utilizes an additional circuit element to couple the sense amplifier latch nodes to the bit lines in the form of N-channel MOS pass transistors having their gate tied to a source of VCCP in accordance with the disclosure of the present invention.

With reference now to 1A, one conventional method of coupling the latch nodes of a sense amplifier to the bit lines is illustrated through the use of a direct electrical connection. The circuit 10 illustrated comprises, simply the direct connection of the complementary sense amplifier latch nodes ("LAT" and LAT bar "LATB") to the corresponding bit lines 12 and 14 ("BIT" and BIT bar, the latter illustrated by an overstrike). This configuration, while most simple to implement, does not serve to isolate the latch nodes from the relatively large bit line capacitance during write operations, thereby impeding the speed at which they can change state.

With reference additionally now to FIG. 1B, another conventional method of coupling the latch nodes of a sense amplifier to the bit lines is illustrated. In this instance, the circuit 20 comprises a pair of N-channel MOS transistors 22, 24 that have their gate terminals driven by a separate signal line 26. While this technique generally serves to isolate the bit line capacitance from the sense amplifier latch nodes, in order to implement this configuration, the signal line 26 must be laid out and routed and a controlled, or "clocked" signal developed and applied to the gates of the transistors 22, 24.

With reference additionally now to FIG. 2, a detailed schematic illustration of a circuit 60 including the latch nodes 66A, 66B and bit lines 62A, 62B with an associated latch circuit 46 as will be more fully described hereinafter. The circuit 60 utilizes a corresponding pair of additional circuit elements 64A, 64B to couple the sense amplifier latch nodes 66A, 66B to the bit lines 62A, 62B as will also be more fully described hereinafter. In this representative embodiment, the additional circuit elements 64A, 64B are provided in the form of N-channel MOS pass transistors having their gate tied to a source of VCCP and do not require a controlled, or "clocked" signal to be generated or routed thereto. The circuit 60 includes N-channel transistors 68A, 68B coupling the latch nodes 66A and 66B respectively to nodes DW 70A and DWB 70B.

The latch circuit 46 comprises a P-channel transistor 82 which has one terminal thereof coupled to VCC and its gate terminal coupled to receive a latch P-channel bar ("LPB") signal on line 90. Its remaining terminal is coupled to one side of a pair of cross-coupled inverters at one terminal of P-channel transistors 84, 94. P-channel transistor 84 is connected in series with N-channel transistor 86 which has its other terminal coupled to one terminal of an N-channel transistor 98. P-channel transistor 94 is also connected in series with N-channel transistor 96 which likewise has its other terminal coupled to the same terminal of N-channel transistor 98. The gate terminals of transistors 84 and 86 are coupled to latch node 66B as well as to the output node of the inverter comprising P-channel transistor 94 and N-channel transistor 96 while the gate terminals of transistors 94, 96 are coupled to latch node 66A as well as to the output node of the inverter comprising P-channel transistor 84 and N-channel transistor 86. The additional N-channel transistor 98 couples the latch circuit to circuit ground and is controlled by a latch N-channel bar ("LNB") signal on line 100. The circuit 60 is selected by an active "high" column select write ("YW") signal which is applied to the gates of N-channel transistors 68A and 68B as shown.

As stated previously, the additional circuit elements 64A and 64B, in the form of N-channel pass transistors, are respectively connected between latch node 66A (LAT) and bit line 62A (BL) and between latch node 66B (LATB) and bit line 62B BLB. The gates of these transistors are connected to VCCP, which is a constant voltage equal to about 2 times the supply voltage level of VCC. The purpose of these transistors is to isolate the large capacitance on the bit lines 62A, 62B from the latch nodes 66A, 66B. This allows the latch nodes 66A, 66B to be driven quickly through transistors 68A and 68B during a write operation. Also, this enables the latch nodes 66A, 66B to transition quickly during sensing which increases the speed of read operations.

In this particular embodiment the N-channel circuit elements 64A and 64B are held "on" at all times and act as routine paths between the corresponding latch nodes 66A, 66B and bit lines 62A, 62B. In conventional designs such as that illustrated in FIG. 1B, the transistors 22, 24 are required to be either switched "on" and "off" or have their gate voltages change levels to control sensing and/or writing speed. Through the tying of the transistor gates to a constant VCCP no switching signal need be developed or routed to the transistor gates and also reduces the amount of current required from the VCCP pumped high voltage supply.

With reference additionally now to FIGS. 3A through 3E, representative alternative implementations of the additional circuit elements 64A and 64B which may be utilized for coupling the sense amplifier latch nodes 66A, 66B to the bit lines 62A, 62B are shown as possible alternatives to the N-channel transistors illustrated in the preceding figure having their gate tied to VCCP. With specific reference to FIG. 3A, the additional circuit elements 64A and 64B may comprise simple resistors or, as shown in FIG. 3B, depletion MOS transistors having their gate tied to the supply voltage VCC. Alternatively, the depletion MOS transistors of this figure may be configured such that their gates are tied to either the corresponding one of the latch nodes 66A, 66B as shown in FIG. 3C or to the corresponding one of the bit lines 62A, 62B as shown in FIG. 3D. Yet another possible implementation of the additional circuit elements 64A, 64B is shown in FIG. 3E wherein CMOS pass gates comprising parallel coupled P-channel and N-channel transistors may be utilized with the gates of the P-channel devices tied to a reference voltage level (VSS, or circuit ground) and the gates of the N-channel devices coupled to the supply voltage VCC.

While there have been described above the principles of the present invention in conjunction with specific circuit elements and configurations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A sense amplifier circuit for an integrated circuit memory comprising:

first and second complementary bit lines;

first and second complementary latch nodes;

first and second unclocked circuit elements each having a control terminal coupled to a constant voltage source greater than a supply voltage level supplied to said sense amplifier circuit respectively coupling said first bit line to said first latch node and said second bit line to said second latch node; and a latch circuit coupled between said first and second latch nodes.

2. The sense amplifier circuit of claim 1 wherein said first and second unclocked circuit elements comprise first and second transistors.

3. The sense amplifier circuit of claim 2 wherein said first and second transistors comprise N-channel MOS transistors.

4. The sense amplifier circuit of claim 1 wherein said constant voltage source is substantially two times greater than said supply voltage level.

5. The sense amplifier circuit of claim 1 wherein said first and second unclocked circuit elements comprise:

first and second depletion transistors.

6. The sense amplifier circuit of claim 5 wherein said first and second depletion transistors comprise control terminals thereof coupled to a supply voltage level.

7. The sense amplifier circuit of claim 1 wherein said first and second unclocked circuit elements comprise:

first and second CMOS pass gates, each of said pass gates comprising a parallel coupled P-channel and N-channel transistor.

8. The sense amplifier circuit of claim 7 wherein each of said P-channel and N-channel transistors comprise a control terminal thereof, said control terminals of said P-channel transistors being coupled to a reference voltage level and said control terminals of said N-channel transistors being coupled to a supply voltage level.

9. A sense amplifier circuit for an integrated circuit memory comprising:

first and second complementary bit lines;

first and second complementary latch nodes; and first and second MOS transistors respectively coupling said first bit line to said first latch node and said second bit line to said second latch node, said first and second MOS transistors having a control terminal thereof coupled to a constant voltage source greater than a supply voltage level supplied to said sense amplifier circuit.

10. The sense amplifier circuit of claim 9 wherein said constant voltage source comprises a voltage level greater than a supply voltage level supplied to said sense amplifier circuit.

11. The sense amplifier circuit of claim 10 wherein said constant voltage source is substantially two times greater than said supply voltage level.

12. A sense amplifier circuit for an integrated circuit memory comprising:

first and second complementary bit lines;

first and second complementary latch nodes; and first and second depletion transistors including control terminals thereof coupled to a constant supply voltage greater than a supply voltage level supplied to said sense amplifier circuit level respectively coupling said first bit line to said first latch node and said second bit line to said second latch node.

13. A sense amplifier circuit for an integrated circuit memory comprising:

first and second complementary bit lines;

first and second complementary latch nodes; and first and second CMOS pass gates respectively coupling said first bit line to said first latch node and said second bit line to said second latch node, each of said pass gates comprising a parallel coupled P-channel and N-channel transistor, wherein each of said P-channel and N-channel transistors include a control terminal thereof, said control terminals of said P-channel transistors being coupled to a constant reference voltage level and said control terminals of said N-channel transistors being coupled to a constant supply voltage level greater than a supply voltage level supplied to said sense amplifier circuit.

14. A sense amplifier circuit for an integrated circuit memory comprising:

a single pair of bit lines including:

first and second complementary bit lines;

first and second complementary latch nodes;

first and second unclocked N-channel MOS transistors each having a control terminal coupled to a constant voltage source having a voltage level greater than a supply voltage level supplied to said sense amplifier circuit respectively coupling said first bit line to said first latch node and said second bit line to said second latch node; and a latch circuit coupled between said first and second latch nodes.

15. The sense amplifier circuit of claim 14 wherein said constant voltage source is substantially two times greater than said supply voltage level.

16. A sense amplifier circuit for an integrated circuit memory comprising:

a single pair of bit lines including:

first and second complementary bit lines;

first and second complementary latch nodes; and first and second MOS transistors respectively coupling said first bit line to said first latch node and said second bit line to said second latch node, said first and second MOS transistors having a control terminal thereof coupled to a constant voltage source having a voltage level greater than a supply voltage level supplied to said sense amplifier circuit.

17. The sense amplifier circuit of claim 16 wherein said constant voltage source is substantially two times greater than said supply voltage level.

* * * * *